United States Patent
Shepard

(10) Patent No.: US 8,451,024 B2
(45) Date of Patent: *May 28, 2013

(54) BIPOLAR-MOS DRIVER CIRCUIT

(75) Inventor: Daniel R. Shepard, North Hampton, NH (US)

(73) Assignee: Contour Semiconductor, Inc., Billerica, MA (US)

(*) Notice: Subject to any disclaimer, the term of this patent is extended or adjusted under 35 U.S.C. 154(b) by 3 days.

This patent is subject to a terminal disclaimer.

(21) Appl. No.: 13/267,985

(22) Filed: Oct. 7, 2011

(65) Prior Publication Data

US 2012/0086473 A1    Apr. 12, 2012

Related U.S. Application Data

(63) Continuation of application No. 12/827,545, filed on Jun. 30, 2010, now Pat. No. 8,035,416.

(60) Provisional application No. 61/270,342, filed on Jul. 7, 2009.

(51) Int. Cl.
*H03K 19/0175* (2006.01)
*H03K 19/094* (2006.01)

(52) U.S. Cl.
USPC ............................................. 326/84; 326/110

(58) Field of Classification Search
USPC .................. 326/82–84, 110; 365/163, 189.08, 365/225.6–225.7
See application file for complete search history.

(56) References Cited

U.S. PATENT DOCUMENTS

| | | | | | |
|---|---|---|---|---|---|
| 4,236,121 | A | * | 11/1980 | Senturia | 331/57 |
| 4,813,020 | A | * | 3/1989 | Iwamura et al. | 365/189.09 |
| 5,166,551 | A | * | 11/1992 | Kamuro | 326/84 |
| 5,198,704 | A | * | 3/1993 | Nitta et al. | 326/84 |
| 5,365,123 | A | * | 11/1994 | Nakase et al. | 326/109 |
| 5,404,056 | A | * | 4/1995 | Maeda | 326/84 |
| 5,696,715 | A | * | 12/1997 | Maejima et al. | 365/177 |
| 5,881,221 | A | * | 3/1999 | Hoang et al. | 714/42 |
| 6,091,278 | A | * | 7/2000 | Tan | 327/432 |
| 7,813,157 | B2 | * | 10/2010 | Shepard | 365/105 |
| 8,035,416 | B1 | * | 10/2011 | Shepard | 326/84 |
| 2006/0171194 | A1 | * | 8/2006 | Lowrey et al. | 365/154 |
| 2008/0288785 | A1 | * | 11/2008 | Rao et al. | 713/190 |
| 2010/0061145 | A1 | * | 3/2010 | Weis | 365/163 |

* cited by examiner

*Primary Examiner* — Jason M Crawford
(74) *Attorney, Agent, or Firm* — Bingham McCutchen LLP

(57) ABSTRACT

The present invention relates to electronic driver circuits, and more particularly, to low power electronic driver circuits having low manufacturing costs. The present invention is a circuit design that utilizes two transistor types that can be manufactured together thereby reducing the number of processing steps and masks and resulting in lower cost.

12 Claims, 2 Drawing Sheets

BIPOLAR-MOS DRIVER CIRCUIT

CROSS-REFERENCE TO RELATED APPLICATIONS

This application is a continuation of U.S. patent application Ser. No. 12/827,545, filed on Jun. 30, 2010, which claims priority to and the benefit of U.S. Provisional Patent Application No. 61/270,342, filed on Jul. 7, 2009, the entire disclosure of each of which is incorporated by reference herein.

FIELD OF THE INVENTION

The present invention relates to electronic driver circuits, and more particularly, to low power electronic driver circuits having low manufacturing costs.

SUMMARY OF THE INVENTION

Logic circuits have been constructed from many different transistor types. The preferred type at present for portable devices is CMOS. Bipolar circuits, such as TTL or RTL, are very fast but consume much power. This is because current is flowing continuously. TTL will typically utilize PNP and NPN type bipolar transistors. CMOS utilizes two transistor types: NMOS and PMOS. The advantage to CMOS is that only one of two transistors is switched on at a time resulting in a circuit in which current flows only when the logic state is switching. Certain capacitances in the circuit (e.g., the gate of the MOS devices) can result in slower operation, but power consumption is low. A disadvantage to these approaches is that of the multiple transistor types, each can require a large number of processing steps and photolithography masks to manufacture. Multiple types means multiple large sets of processing steps and expensive masks.

The present invention is a circuit design that utilizes two transistor types that can be manufactured together thereby reducing the number of processing steps and masks and resulting in lower cost.

DESCRIPTION OF THE PREFERRED EMBODIMENT

Figure 1:
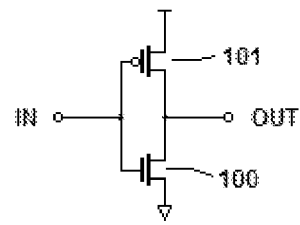
FIG. 1 illustrates a prior art driver circuit using CMOS logic.

Logic circuits have been constructed from many different transistor types. FIG. 1 depicts a prior art CMOS logic device (an inverter). The device is simple in design having just an NMOS 100 and a PMOS 101 transistor. When the input is high, the NMOS transistor 100 is switched on and the PMOS transistor 101 is switched off; with the NMOS transistor 100 switched on, the output is connected through the NMOS transistor 100 to ground. When the input is low, the PMOS transistor 101 is switched on and the NMOS transistor 100 is switched off; with the PMOS transistor 101 switched on, the output is connected through the PMOS transistor 101 to the positive supply. Since the NMOS 100 and PMOS transistor 101 are not on simultaneously (except for a moment during transition of the input from high to low or low to high), current does not flow in the circuit except during switching. Even at the output, given the typical case where the output is connected to the input of another similar device, current only flows through the switched on NMOS 100 or PMOS transistor 101 during transition so as to charge or discharge the MOS transistor gates of the subsequent stages.

Figure 2:
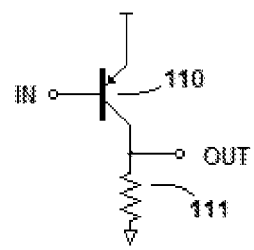
FIG. 2 illustrates a prior art, RTL driver circuit using bipolar logic.

With a bipolar circuit, as is depicted in FIG. 2, current typically flows from stage to stage as a function of the logic state. In FIG. 2, a RTL inverter will consume no power when the input is high as this will reverse bias the base junction of PNP transistor 110 resulting in that transistor being switched off. However, when the input is low, current flows from the positive supply through the emitter and base connections and to the low input source; current also flows from the positive supply through the transistor 110 and through resistor 111 to ground resulting in a high voltage at the output. In a typical case where the output is connected to the input of a similar circuit, when current is flowing through the first circuit resulting in a high output, the transistor of a subsequent circuit will be switched off. However, when the input is high to the first circuit and the current if not flowing, the output will be low and a subsequent circuit will have current flowing from the positive supply through the emitter-base junction and back into the resistor of the prior circuit. Current typically is flowing somewhere all the time. The same is generally true for RTL constructed from NPN transistors and for TTL logic. One advantage to RTL is that is can be made from a single transistor type (NPN or PNP).

Figure 3:
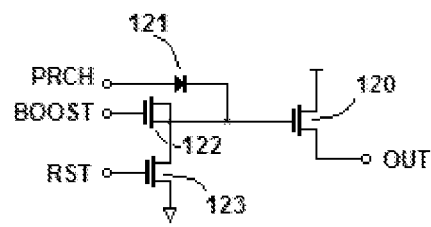
FIG. 3 illustrates a prior art driver circuit using NMOS logic.

What is needed is a logic design in which only one transistor type is used and current generally does not continuously flow. One such design is shown in FIG. 3. In this MOS design, only NMOS transistors are used. The output is controlled by NMOS transistor 120. A problem presented here is that in order to pass the voltage level of the supply to the output, the voltage on the gate of NMOS transistor 120 must exceed the voltage to be provided to the output by the threshold voltage ($V_{th}$) of the NMOS transistor 120. To achieve this, assuming that the highest available voltage is the supply voltage, the gate voltage must be generated by the circuit. In this case, the voltage on the gate of NMOS transistor 120 is generated in stages. First, the largest available voltage (the supply voltage) is applied to the precharge (PRCH) input through diode 121 while the boost (BOOST) and reset (RST) inputs are held low. Then, the boost input is raised and the rising edge is capacitively coupled through NMOS transistor 122 which is wire up as a capacitor. The capacitively coupled boost voltage will raise the voltage on the gate resulting from the precharge input up to a new higher voltage that will enable the output NMOS transistor 120 to pass the desired voltage to the output. To switch off the output, the precharge input must first be lowered and then the reset input (RST) raised; this will dump the charge from the gate of NMOS transistor 120 through reset NMOS transistor 123 to ground, thereby switching off the output NMOS transistor 120. The disadvantage is that the series of steps to switch on and off the various inputs results in slower operation. (Similar circuits can be constructed using opposite voltage polarities and PMOS transistors.)

Figure 4:
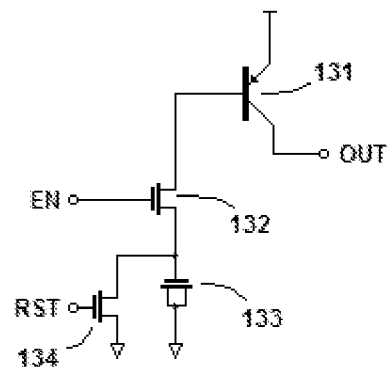
FIG. 4 illustrates a driver circuit according to the present invention.

The present invention is a combination of bipolar logic and MOS logic. FIG. 4 depicts a bipolar-MOS type circuit. In this circuit, output PNP transistor 131 will provide a voltage pulse to the output that can be within the emitter-collector saturation voltage ($V_{CESAT}$) of the positive supply. This is accomplished by connecting the base of PNP transistor 131 through enable NMOS transistor 132 to NMOS transistor 133 which is wired up as a capacitor; the current will flow from the positive supply through the emitter-base junction of PNP transistor 131 and into capacitor 133 until that capacitor is fully charged. The size of capacitor 133 determines the duration of this current pulse. While this current pulse is flowing, current will flow to the output in an amplified amount as a function of the gain (i.e., the transistor Beta, β) of PNP transistor 131. When capacitor 133 is charged, the current through PNP transistor 131 stops flowing. The enable NMOS transistor 132 is turned on by raising the voltage on the enable input (EN). The circuit is reset by lowering the voltage on the enable input (EN) and then raising the voltage on reset input (RST) which will cause the charge on reset NMOS transistor 134 to be dumped to ground. Because PNP transistor 131 is switched on by lowering the voltage on its base, no boost voltage level is required and the two steps of precharging and then boosting as is required for the circuit depicted in FIG. 3 is replaced by the single step of raising the enable input in the circuit depicted in FIG. 4. This results in greater speed in operation. Furthermore, since the current only flows when the enable input (EN) is first raised (i.e., until capacitor 133 is charged), the power consumed is similar to that of a CMOS circuit (i.e., current only flows during switching while the gate of a MOS transistor is being charged). Also, the output voltage pulse can come to within $V_{CESAT}$ of the supply voltage without boost circuitry. (Similar circuits can be constructed using opposite voltage polarities and PMOS and NPN transistors.)

A variation on the circuit of FIG. 4, would be to eliminate the capacitor (transistor 133) and connect enable NMOS transistor 132 directly between the base of PNP transistor 131 and ground (eliminating the capacitor 133 also eliminates the requirement for a reset transistor 134 as well). While this variation will consume more power for the static current path from the supply voltage through PNP transistor 131 and enable NMOS transistor 132 to ground, it is a simpler circuit that can be operated for longer than just the time to charge the capacitor (transistor 133). Alternatively, reset NMOS transistor 134 could be switched on while enable input (EN) is high thereby bypassing capacitor transistor 133 to accomplish the same effect.

Figure 5:
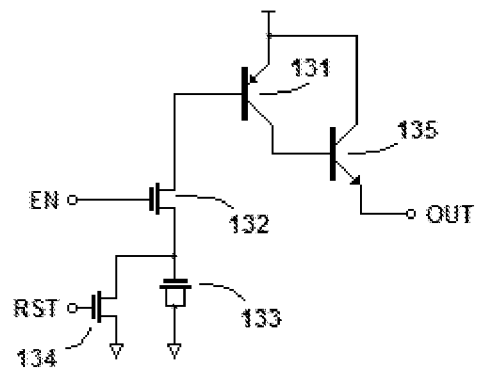
FIG. 5 illustrates a driver circuit according to the present invention with output amplification.

FIG. 5 depicts an identical circuit to that depicted in FIG. 4 except that the output has increased gain. In this instance, the current to the output is increased by an additional β multiplier (of secondary output NPN transistor 135) in a darlington-like configuration. The tradeoff is that the maximum output voltage is an additional $V_f$ lower than that of the circuit of FIG. 4 due to the forward voltage drop ($V_f$) of the base-emitter junction of NPN transistor 135.

The present invention can be manufactured using standard processes. In the course of manufacturing the MOS transistors, polysilicon gate material is deposited and this is then patterned and etched and then dopants are implanted. With the present invention, some of the polysilicon material deposited to form the MOS gates can be patterned and etched to remain above areas that are just field oxide or the like. Then, when implanting the MOS transistors, this poly can be implanted to form the PNP transistors at the same time. When contacts to the MOS gates are formed, contacts to the base, emitter and collectors of the PNP transistors can also be formed at the same time.

Furthermore, the present invention can be used in a variety of circuits. In particular, embodiments of the present invention can be used in the design of devices such as memory products, and in particular non-volatile memory products, for portable devices wherein low power is desirable as well as other devices wherein low power may not be as necessary.

The present invention can be implemented with cross point memory arrays wherein the memory arrays' surrounding circuitry is also implemented with embodiments of the present invention; these arrays may be one of many tiles or sub-arrays in a larger device or an array within a 3-D arrangement of arrays or tiles. In such a memory device, the storage cells can incorporate field-emitters, diodes or other non-linear conductor devices that conduct current better in one direction than the other for a given applied voltage. The storage element can be a fuse, an antifuse, a phase-change material such as a Chalcogenide (including a Chalcogenide in which the programmed resistivity can be one of two resistance values and, in the case of more than one bit per cell storage cells, in which the programmed resistivity can be one of three or more resistance values), a resistance that can be electrically altered, or a field-emitter element programming mechanism including an element for which the resistance or the volume is changeable and programmable.

The bipolar-MOS driver of the present invention will find applications in array circuits such as a memory array, display array, and the like. In such array applications, the mechanism to control the voltage on the enable input (EN) can be implemented as is done in U.S. patent application Ser. No. 11/926,778 and this Allowed patent application Ser. No. 11/926,778 is hereby included herein by reference in its entirety. In that allowed patent application Ser. No. 11/926,778, the gates of the MOS drivers on a plurality of row lines (said plurality comprising either all of the rows or a subset of the rows) of the array are all charged by a precharge mechanism and then all but one driver is discharged by means of a binary diode decoder/selector array (using diodes or some other non-linear current steering devices) thereby leaving one driver enabled. In the present invention, a plurality of driver bipolar transistor 131/enable MOS transistor 133 pairs associated with a plurality of row lines of the array (said plurality comprising either all of the rows or a subset of the rows of the array) could be activated by charging the base of every enable MOS transistor 133 of the plurality (but, typically while the supply voltage is switched off by a switching means, said means not shown in FIG. 4, but that is well understood by those skilled in the art) and then all but one enable MOS transistor 133 is discharged by means of a binary diode decoder/selector array (using diodes or some other non-linear current steering devices or other decoding selection means) thereby leaving only one driver enabled. After such a precharge and then all-but-one disabling of drivers, the supply voltage could be switched on. (Of course, the row lines could be column lines if the array were rotated 90 degrees.)

Memory devices incorporating embodiments of the present invention may be applied to memory devices and systems for storing digital text, digital books, digital music (such as MP3 players and cellular telephones), digital audio, digital photographs (wherein one or more digital still images can be stored including sequences of digital images), digital video (such as personal entertainment devices), digital cartography (wherein one or more digital maps can be stored, such as GPS devices), and any other digital or digitized information as well as any combinations thereof. Devices incorporating embodiments of the present invention may be embedded or removable, and may be interchangeable among other devices that can access the data therein. Embodiments of the invention may be packaged in any variety of industry-standard form factor, including Compact Flash, Secure Digital, MultiMedia Cards, PCMCIA Cards, Memory Stick, any of a large variety of integrated circuit packages including Ball Grid Arrays, Dual In-Line Packages (DIP's), SOIC's, PLCC, TQFP's and the like, as well as in proprietary form factors and custom designed packages. These packages can contain just the memory chip, multiple memory chips, one or more memory chips along with other logic devices or other storage devices such as PLD's, PLA's, micro-controllers, microprocessors, controller chips or chip-sets or other custom or standard circuitry.

Many variations come to mind in light of the present teaching. These include using any combination of switch devices that can be manufactured in parallel, or mostly or generally in parallel, in a semiconductor fabrication facility (fab).

The foregoing description of and examples of the preferred embodiment of the invention and the variations thereon have been presented for the purposes of illustration and description. It is not intended to be exhaustive or to limit the invention to the precise forms disclosed. Many modifications and variations are possible in light of the above teaching. It is intended that the scope of the invention be limited not by this detailed description.

I claim:

1. A non-CMOS electronic circuit for driving a memory array, the non-CMOS electronic circuit comprising:
   a bipolar transistor;
   a MOS transistor functionally connected to a base of the bipolar transistor;
   a capacitor functionally connected to the MOS transistor and the base of the bipolar transistor; and
   a plurality of additional MOS transistors, at least one of which is electrically connected to at least one of the bipolar transistor or the MOS transistor,
   wherein (i) current flows through an emitter-base junction of the bipolar transistor only after a voltage on a gate of the MOS transistor is applied and until the capacitor is fully charged, and (ii) a type of the MOS transistor and each of the plurality of additional MOS transistors is the same, the type being selected from the group consisting of NMOS and PMOS.

2. The non-CMOS electronic circuit of claim 1, wherein the MOS transistor is an NMOS transistor and the bipolar transistor is a PNP transistor.

3. The non-CMOS electronic circuit of claim 1, wherein the MOS transistor is a PMOS transistor and the bipolar transistor is an NPN transistor.

4. The non-CMOS electronic circuit of claim 1, wherein the plurality of additional MOS transistors comprises a reset transistor, a terminal of which is connected between the MOS transistor and the capacitor, for discharging the capacitor in response to a voltage applied to an input of the reset transistor.

5. The non-CMOS electronic circuit of claim 1, wherein the capacitor comprises a MOS transistor configured as a capacitor.

6. The non-CMOS electronic circuit of claim 1, further comprising a memory array electrically connected to the bipolar transistor.

7. The non-CMOS electronic circuit of claim 6 wherein said memory array is removable and interchangeable.

8. The non-CMOS electronic circuit of claim 6, wherein the memory array comprises a non-volatile storage element comprising a chalcogenide alloy.

9. The non-CMOS electronic circuit of claim 6, wherein the memory array comprises a non-volatile one-time-programmable storage element.

10. The non-CMOS electronic circuit of claim 6, wherein the memory array comprises a cross-point array.

11. The non-CMOS electronic circuit of claim 6, wherein the memory array comprises a plurality of cross-point arrays arranged three-dimensionally.

12. The non-CMOS electronic circuit of claim 6, wherein the memory array comprises a plurality of memory cells each comprising a memory MOS transistor, a type of all of the memory MOS transistors being the same as the type of the MOS transistor and each of the plurality of additional MOS transistors.

* * * * *